(12) United States Patent
Lautzenhiser et al.

(10) Patent No.: US 6,650,180 B2
(45) Date of Patent: Nov. 18, 2003

(54) TOTEM POLE RF AMPLIFIERS WITH PHASE AND AMPLITUDE CORRECTION

(75) Inventors: Lloyd Lynn Lautzenhiser, Sun Valley, NV (US); Barry Arthur Lautzenhiser, Carson City, NV (US)

(73) Assignee: Emhiser Research, Inc., Verdi, NV (US)

( * ) Notice: Subject to any disclaimer, the term of this patent is extended or adjusted under 35 U.S.C. 154(b) by 0 days.

(21) Appl. No.: 10/175,775

(22) Filed: Jun. 20, 2002

(65) Prior Publication Data

US 2002/0186080 A1 Dec. 12, 2002

Related U.S. Application Data

(63) Continuation-in-part of application No. 10/028,844, filed on Dec. 20, 2001.
(60) Provisional application No. 60/258,341, filed on Dec. 27, 2000.

(51) Int. Cl.[7] .................................................. H03F 3/68
(52) U.S. Cl. .................................... 330/124 R; 330/295
(58) Field of Search ............................ 330/124 R, 295, 330/84; 327/295, 426

(56) References Cited

U.S. PATENT DOCUMENTS 4,631,493 A * 12/1986 Vendelin et al. ............ 330/277
4,701,716 A * 10/1987 Poole ........................... 330/43
5,222,246 A * 6/1993 Wolkstein ................... 455/13.4
5,949,287 A 9/1999 Kurusu et al.

OTHER PUBLICATIONS

Kevin W. Kobayashi, Matt Nishimoto, Liem T. Tran, Huei Wang, John C. Cowles, Thomas Ray Block, Jeffrey H. Elliott, Barry R. Allen, Aaron K. Oki, and Dwight C. Streit, A 44-GHz High IP3 InP-HBT Amplifier with Practical Current Reuse Biasing, IEEE Transactions on Microwave Theory and Techniques, Dec., 1998, pp. 2541-2551, vol. 46, No. 12, Figure 6 and p. 2544, col. 2, last paragraph to p. 2545, col. 1, first 14 lines.

* cited by examiner

*Primary Examiner*—Henry Choe
(74) *Attorney, Agent, or Firm*—Wendell E. Miller

(57) ABSTRACT

Apparatus (40, 70, and 80) and method are provided for minimizing power losses when combining rf signals in conductors (50A, 50B, 62A, and 62B) that are at quadrature phase angles. The method includes: mixing rf signals that are at quadrature phase angles; producing a dc voltage from the mixing step that is a function of a phase-angle deviation from quadrature; and correcting the phase-angle deviation. The correcting step includes tuning a length of a selected one of two rf conductors. Preferably, the method also includes equalizing amplitudes of the rf signals. When the method includes series connecting upper (Q1) and lower (Q2) solid-state current devices, the step of equalizing amplitudes of the rf signals includes adjusting a bias voltage of one (Q1) of the solid-state current devices.

30 Claims, 5 Drawing Sheets

TOTEM POLE RF AMPLIFIERS WITH PHASE AND AMPLITUDE CORRECTION

CROSS-REFERENCES TO RELATED APPLICATIONS

The subject patent application is a Continuation-in-Part of U.S. patent application Ser. No. 10/028,844 which was filed on Dec. 20, 2001 and which claims priority to Provisional Patent Application No. 60/258,341 which was filed on Dec. 27, 2000.

STATEMENT RE FEDERALLY SPONSORED RESEARCH OR DEVELOPMENT

Not Applicable.

REFERENCE TO SEQUENCE LISTING

Not Applicable.

BACKGROUND OF THE INVENTION

1. Field of the Invention

The present invention relates generally to apparatus and method for splitting, amplifying, and combining radio frequency (rf) or microwave rf signals. More particularly, the present invention pertains to rf power amplifiers in which field-effect devices are connected in series to dividingly share a dc supply voltage, and in which both apparatus and method are provided for phase correcting and power equalizing rf outputs prior to combining.

2. Description of the Related Art

Gallium arsenide field-effect transistors (GaAsFETs) are the primary solid state devices used for amplification of high frequency signals in the range of 3 Ghz and higher. GaAsFETs have the advantages of being readily available and relatively inexpensive. However, a major disadvantage of GaAsFETs is that the maximum operating voltage is commonly +10.0 volts dc.

For many transmitter/amplifier applications, particularly airborne applications, the dc supply voltage is 28 volts dc, plus or minus 4.0 volts dc. Since gallium arsenide FETs have an operative voltage of +10 volts dc, the use of gallium arsenide FETs has presented a problem.

Traditionally, there have been two solutions to this problem. One is to use a linear voltage regulator. The other is to use a switching regulator.

In linear voltage regulators, the voltage is linearly regulated from the supply of 28 volts to approximately 10 volts with the power difference being dissipated in heat by the regulator. This type of regulation has the disadvantages of excessive heat and low power efficiency.

Switching regulators, on the other hand, are power converters that transfer the power of a higher voltage supply to lower voltage with increased current capacity. This type of regulation has the advantage of low heat dissipation and high power efficiency, but has the disadvantages of increased costs, space inefficiency due to their large size, and the creation of a spurious signal on the rf carrier (EMI problems) due to the switching action of the regulator. A high-attenuation filter is required to suppress this spurious switching signal.

A third approach to solving the problem of disparity between the operating voltage of solid-state current devices and a source voltage has been to connect the solid-state current devices in series, thereby dividingly sharing the source voltage and utilizing the same current flow two or more times. This third approach was presented in *IEEE Transactions on Microwave Theory and Techniques*, Volume 46, Number 12, of December 1998, in an article entitled, "*A 44-Ghz High IP3 InP-HBT Amplifier with Practical Current Reuse Biasing.*"

This type of circuit solves the problem of the disparity between the operating voltage of solid-state current devices and a higher supply voltage by stacking the solid-state current devices in a totem pole fashion so that the source voltage is divided between the solid-state current devices. Two, or more, solid-state current devices are used in series for dc operation, but they are used in parallel for rf operation.

Thus, current that flows in series through the solid-state current devices is used two, or more times, in the production of the rf output. It is used once in each of two, or more, series-connected solid-state current devices, thereby increasing the rf output for a given current flow, as compared to rf amplifiers connected in the conventional fashion.

However, totem pole, voltage-dividing, or current-sharing circuits, have been used only at low rf powers, as in the above-referenced article wherein the power was in the order of 10 milliwatts. At higher rf powers, problems associated with inadequate rf decoupling have included low power efficiency, oscillation, a decrease in reliability of the circuits, and destruction of the solid-state current devices. This problem of inadequate decoupling was solved by Lautzenhiser et al. in U.S. patent application Ser. No. 10/028,844 which was filed on Dec. 20, 2001.

BRIEF SUMMARY OF THE INVENTION

In the rf power amplifiers of the present invention, an rf input signal is supplied to a power splitter, which in the present invention is a quadrature power splitter. The quadrature-split rf signals are separately amplified in solid-state current devices that preferably are field-effect transistors, and that more preferably are gallium-arsenide field-effect transistors (GaAsFETs). The separately-amplified rf signals are supplied to a power combiner, which in the present invention is a quadrature combiner. Optionally, a high-power rf amplifier can be interposed between the drain terminals of the GaAsFETs and rf inputs to the power combiner.

The GaAsFETs are connected in series between positive and negative terminals of a supply voltage, as taught by Lautzenhiser et al. in the aforementioned patent. Drain-to-source voltages of the GaAsFETs dividingly share a supply voltage.

In the present invention, apparatus and method are provided for phase correcting rf output power prior to combining, and for power equalizing the rf outputs prior to combining, thereby further increasing rf power efficiency over the gains made by Lautzenhiser et al. in the aforementioned patent.

Considering further the background of the present invention, in order for a splitter, such as a quadrature splitter used in the subject invention, to operate optimally, three conditions must be met. First, assuming a 50 ohm splitter, the drive impedance as well as the load impedance should be 50 ohms. Second, the splitter should be operating in its design bandwidth. And third, the splitter should be operating in its power range. In the present state of the art, these factors do not present design problems, so the present invention does not address any problem related to any of these three conditions.

In order for a combiner, such as the quadrature combiner that is used in the present invention, to operate optimally, three conditions must be met. First of all, the combiner must output to a 50 ohm load in its design bandwidth. Second, the rf inputs to the combiner should be at 90 degrees. And finally, the rf inputs to the combiner should be at the same power level.

The present invention relates to these last two conditions, namely: the present invention optimizes efficiency of rf amplifiers of the type shown and described herein by correcting the phase angle of the rf inputs to the combiner. And, the present invention optimizes the efficiency of rf amplifiers of the type shown and described herein by equalizing amplitudes of the rf inputs to the combiner.

Phase correction is achieved by measuring a voltage that is a function of the phase error and then by trimming a line length to correct a phase angle of one of the two rf inputs to the combiner. More particularly, an rf mixer is connected across the two rf inputs to the combiner to measure a dc voltage that is a function of any phase-angle error.

That is, when quadrature signals are applied to the RF and LO inputs of an rf mixer, since the two rf inputs have equal frequencies, if no phase error exists, a zero dc voltage at the IF output reflects a zero variation from quadrature phase angles. However, any phase error in the quadrature frequencies will be indicated by a dc voltage. This dc voltage will be plus or minus polarity depending upon whether the actual phase angle is more than, or less than, ninety degrees.

Correction in the phase angles is achieved by a slider that adjustably lengthens or shortens a tuning loop, and by subsequently removing a redundant length of the tuning loop.

Since rf power losses are dissipated in the resistor that connects the combiner to an electrical ground, rf power losses may be measured by replacing the grounding resistor with a power meter. Since this rf power loss may represent a phase error and/or unequal rf power amplitudes, subsequent to phase correcting, the remaining rf power loss is the result of unequal rf power amplitudes delivered to the power combiner.

If GaAsFETs provide the final rf power amplification, equalization of rf power to the combiner is achieved by adjusting gate voltages to values that will produce equal rf outputs from the GaAsFETs. That is, the voltage that is supplied to a gate of the upper one of the GaAsFETs is selectively adjusted, thereby equalizing rf outputs from the GaAsFETs, as taught by Lautzenhiser et al. in the aforementioned patent application and as taught herein.

However, if high-power amplifiers, such as one kilowatt rf amplifiers, are placed intermediate of the GaAsFETs and the combiner, equalizing of rf power into the combiner is still achieved by adjusting voltages on the GaAsFETs. However, rather than making the rf output of the GaAsFETs equal, voltages on the GaAsFETs are adjusted to make the rf outputs of the high-power amplifiers equal, even though this may require making rf outputs of the GaAsFETs unequal, thereby compensating for any difference in gain in the two high-power amplifiers.

While only a few of the possible variations in circuitry are shown herein, the principles taught herein may be applied, for instance, to circuitry shown and described by Lautzenhiser et al. in U.S. patent application Ser. No. 10/028,844 which is incorporated herein by reference thereto. compare with claims In a first aspect of the present invention, a method for minimizing power losses when combining quadrature rf signals from two rf conductors comprises: producing a dc voltage that is an exclusive function of a phase-angle deviation from quadrature; the producing step comprises mixing the quadrature rf signals; correcting the phase-angle deviation; and the correcting step comprises nulling the dc voltage.

In a second aspect of the present invention, a method for minimizing power losses when combining quadrature rf signals from two rf conductors comprises: producing a dc voltage that is a function of a phase-angle deviation from quadrature; the producing step comprises mixing the quadrature rf signals; correcting the phase-angle deviation; and the correcting step comprises nulling the dc voltage.

In a third aspect of the present invention, a method for rf power amplifying with optimal efficiencies comprises: series connecting upper and lower solid-state current devices between a dc supply voltage and a lower dc voltage; splitting an rf input signal into two quadrature rf signals; separately amplifying the quadrature rf signals in the upper and lower solid-state current devices; producing a dc voltage that is an exclusive function of a phase-angle deviation from quadrature that exists between the separately-amplified quadrature rf signals; quadrature combining the separately-amplified quadrature rf signals; correcting the phase-angle deviation; and the correcting step comprises nulling the dc voltage.

In a fourth aspect of the present invention, a method for rf power amplifying with optimal efficiencies comprises: series connecting upper and lower solid-state current devices between a dc supply voltage and a lower dc voltage; splitting an rf input signal into two quadrature rf signals; separately amplifying the quadrature rf signals in the upper and lower solid-state current devices; producing a dc voltage that is a function of a phase-angle deviation from quadrature that exists between the separately-amplified quadrature rf signals; the producing step comprises mixing the quadrature rf signals; quadrature combining the separately-amplified quadrature rf signals; correcting the phase-angle deviation; and the correcting step comprises nulling the dc voltage.

In a fifth aspect of the present invention, a method for minimizing power losses when combining quadrature rf signals from two rf conductors comprises: producing a dc voltage from the two rf conductors that is a function of a phase-angle deviation from quadrature; the producing step comprises mixing the quadrature rf signals; measuring a power loss that is generated by combining the quadrature rf signals and that is a function of both the phase-angle deviation and unequal amplitudes of the quadrature rf signals; reducing the phase-angle deviation as indicated by reductions in the dc voltage; and equalizing the amplitudes of the quadrature rf signals as indicated by reductions in the measured power loss.

In a sixth aspect of the present invention, a method for minimizing power losses when combining quadrature rf signals from two rf conductors comprises: producing a dc voltage whose magnitude is a function of a phase-angle deviation in the rf signals from quadrature, and whose polarity indicates a direction of the deviation from quadrature; the producing step comprises mixing the quadrature rf signals; correcting the phase-angle deviation in accordance with both the magnitude and the polarity; and the correcting step comprises nulling the dc Voltage.

DETAILED DESCRIPTION OF THE INVENTION

Figure 1:
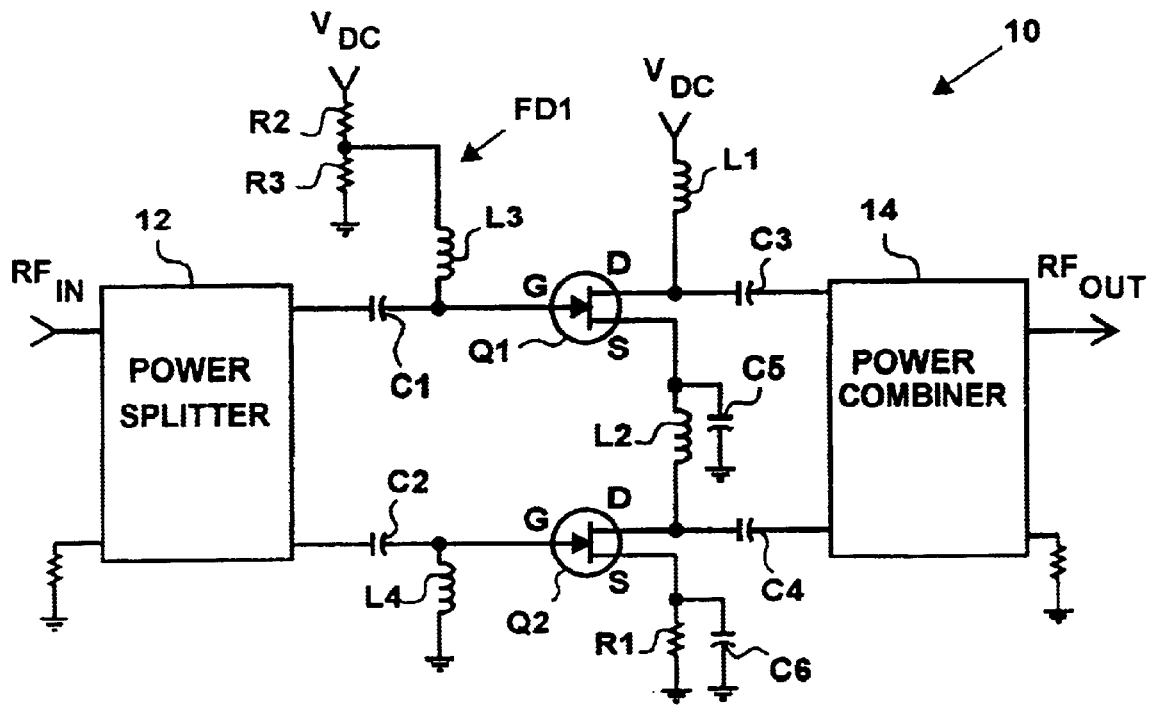
FIG. 1 is an rf power amplifier, as also taught by Lautzenhiser et al. in the aforementioned patent application, that includes two, n-channel, gallium arsenide FETs that are stacked to dividingly share the supply voltage, an rf splitter, and an rf combiner.

Referring now to FIG. 1, an rf power amplifier 10 includes solid-state current devices, n-channel gallium arsenide field-effect transistors, GaAsFETs, or FETs, Q1 and Q2 that are connected in series between a positive supply voltage $V_{DC}$ and a ground.

More particularly, a first rf choke L1 connects the supply voltage $V_{DC}$ to a drain terminal of the FET Q1, a second rf choke L2 connects a source terminal of the FET Q1 to a drain terminal of the FET Q2, and a resistor R1 connects a source terminal of the FET Q2 to a ground.

The rf power amplifier 10 also includes an rf power splitter 12 and an rf power combiner 14. The rf power splitter 12 is connected to gate terminals of the FETs Q1 and Q2, respectively, by coupling capacitors C1 and C2. The rf power combiner 14 is connected to drain terminals of the FETs Q1 and Q2, respectively, by coupling capacitors C3 and C4. And source terminals of the FETs Q1 and Q2 are connected to an rf ground by decoupling capacitors C5 and C6, respectively. The rf power splitter 12 may be an in-phase splitter, or it may split at some other phase-angle, such as a quadrature splitter that splits at ninety degrees.

A fixed voltage divider FD1, that includes resistors R2 and R3, is connected to the supply voltage $V_{DC}$, and supplies a bias voltage to the gate terminal of the FET Q1 through a third rf choke L3. The resistor R1 supplies a negative gate-to-source bias for the gate terminal of the FET Q2 through a fourth rf choke L4.

The resistor R1, in setting the gate-to-source bias for the FET Q2, controls current flow through both FETs, Q1 and Q2. This principle is incorporated into the embodiment of FIG. 2 where an npn bipolar transistor Q3 replaces the resistor R1, thereby providing means for variably controlling the gate-to-source bias for the FET Q2, thereby providing means for controlling current through the FETs Q1 and Q2, and thereby providing means for variably controlling power amplification of the FETs Q1 and Q2.

Continuing to refer to FIG. 1, if the supply voltage is 22.0 volts dc, and if the resistor R1 provides a 2.0 voltage drop between the source terminal of the FET Q2 and a ground, assuming equal current through the FETs, Q1 and Q2, the remaining 20.0 volts will be equally divided, thereby providing 10.0 volts for each FET, Q1 and Q2, with the FET Q2 having 22.0 volts applied to the drain terminal and 12.0 volts applied to the source terminal.

If then, resistances of the resistors R2 and R3 are proportioned to provide 10.0 volts to the gate terminal of the FET Q1, a negative gate-to-source bias of 2.0 volts will be provided for the FET Q1. In like manner, with 12.0 volts being applied to the drain terminal of the FET Q2 and 2.0 volts being applied to the source terminal, an electrical ground will be 2.0 volts below the voltage that is applied to the source terminal, thereby providing a negative gate-to-source bias of 2.0 volts for the FET Q2, since the gate terminal of the FET Q2 is connected to an electrical ground through the rf choke L4.

In operation, an input signal at an rf input $RF_{IN}$ is split in the rf power splitter 12, amplified in the FETs Q1 and Q2, and combined in the rf power combiner 14 to provide a power amplified output at an rf output $RF_{OUT}$.

The amplification function of the FETs Q1 and Q2 is maintained by using rf chokes, L1, L2, L3, and L4, to keep the rf signal from coupling onto the dc bias lines and to prevent rf interference between FETs Q1 and Q2; and decoupling capacitors, C5 and C6, are used to keep the source terminals of both FETs, Q1 and Q2, at an rf ground.

Since the performance of the rf power amplifiers of the present invention rest heavily on correct design and application of the rf chokes, L1, L2, L3, and L4, and the decoupling capacitors, C5 and C6, their design and selection will be considered in greater detail subsequently.

Figure 1A:
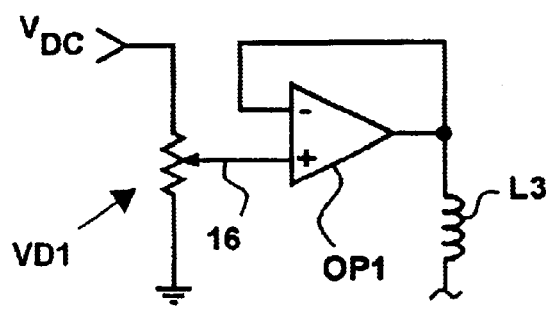
FIG. 1A replaces the fixed voltage divider of FIG. 1 with a potentiometer and adds a buffer for the gate-to-source bias of Q1, as also taught by Lautzenhiser et al. in the aforementioned patent application.

Referring now to FIG. 1A, the voltage divider FD1, that includes the resistors R2 and R3, has been replaced by a variable voltage divider, or potentiometer, VD1. And an operational amplifier, OP1, configured as a buffer, has been inserted in series with the rf choke L3.

Referring now to FIGS. 1 and 1A, with regard to the potentiometer VD1 of FIG. 1A, if any drain-to-source bias imbalances occur between the FETS, Q1 and Q2, when applying an rf signal, the drain-to-source biases of the FETs Q1 and Q2 may be equalized by adjusting a wiper 16 of the potentiometer VD1, thereby adjusting the gate-to-source bias of both FETs, Q1 and Q2.

Continuing to refer to FIGS. 1 and 1A, with regard to the operational amplifier OP1, the gate current of the FET Q1 must be accounted for when biasing the gate, particularly in high-power rf applications. If the gate current changes when the amplifier is tuned across a frequency band or operated over varying environmental conditions, the operational amplifier OP1 may be inserted between the voltage divider and the gate of the FET Q1, as shown, to prevent the varying gate current from affecting the fixed voltage divider FD1 and therefore the bias of both FETs, Q1 and Q2. A buffer is required since the gate current may be bi-directional under the varying operating conditions.

Figure 2:
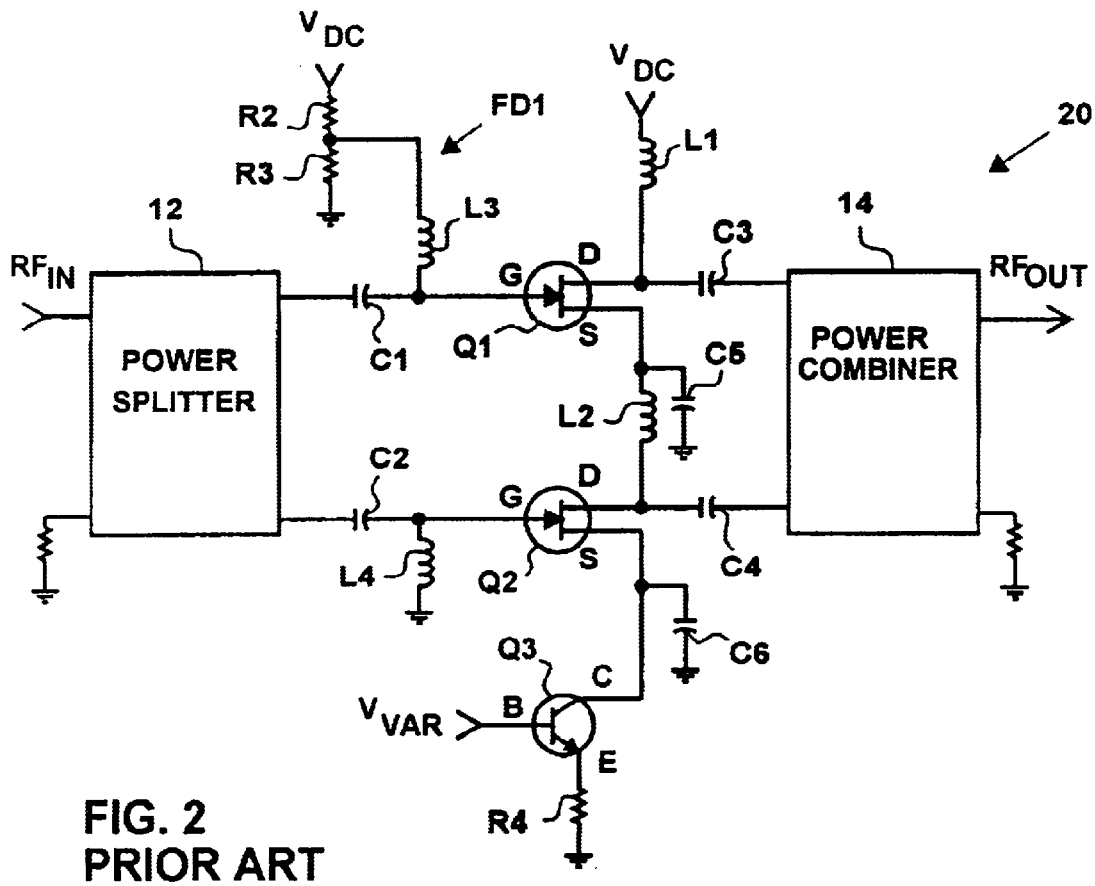
FIG. 2 is a variable rf power amplifier, as also taught by Lautzenhiser et al. in the aforementioned patent application, in which an npn bipolar transistor is stacked with the two FETs of FIG. 1 and replaces the source resistor of the lower FET, thereby providing current control of both FETs as a function of voltage applied to the base of the npn bipolar transistor.

Referring now to FIG. 2, an rf power amplifier, or variable rf power amplifier, 20 includes like-named and like-numbered components as those in FIG. 1, except that the npn bipolar transistor Q3 has been placed in series with the FETs Q1 and Q2, and the resistor R1 has been replaced by a resistor R4.

Continuing to refer to FIG. 2, the npn bipolar transistor Q3 has been placed in the stack, in totem pole arrangement, with the FETs Q1 and Q2, with a collector terminal of the npn bipolar transistor Q3 connected to the source terminal of the FET Q2, and with an emitter terminal of the transistor Q3 connected to the resistor R4. Thus, the npn bipolar transistor Q3 dividingly shares the supply voltage with the FETs Q1 and Q2, and thereby uses the same current, even as the FETs Q1 and Q2 of FIG. 1 dividingly share the supply voltage and use the same current.

Since GaAsFETs may be biased for linear amplification (Class A Amplifiers), or semi-linear amplification, (Class B or A/B Amplifiers), amplification is approximately a linear function of the drain current. Therefore, by placing a variable current device, such as the transistor Q3, in series with the FET Q2, the rf power amplifier 10 of FIG. 1 becomes the variable rf power amplifier 20 of FIG. 2. Power amplification is variably controlled by controlling a voltage $V_{VAR}$ to a base terminal of the npn bipolar transistor Q3.

Referring again to FIG. 1, as stated previously, the amplification function of the FETs, such as the FETs Q1 and Q2, is maintained by using rf chokes, such as the rf chokes, L1, L2, L3, and L4, to keep the rf signal from getting onto the dc bias lines and to prevent rf interference between the series-connected FETs; and decoupling capacitors, such as the decoupling capacitors C5 and C6, are used to keep the sources of FETs at an rf ground.

The selection of the decoupling capacitors and chokes are both critical to the rf performance of the circuit, particularly for high power rf amplifiers, although selection of decoupling capacitors is the most critical. Decoupling capacitors, such as the decoupling capacitors C5 and C6 are selected for both resonant frequencies at or very near to the circuit operating frequency and the lowest possible effective (or equivalent) series resistances (ESRs). The rf chokes, such as the rf chokes L1, L2, L3, and L4, preferably are inductors with self-resonant frequencies at or very near to the circuit operating frequency.

Figure 3:
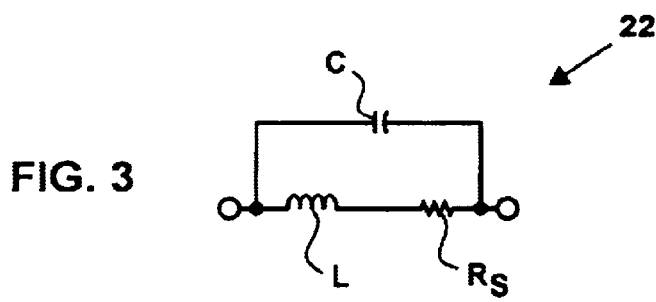
FIG. 3 is a model for simulating a microwave inductor.

Referring now to FIG. 3, a microwave circuit model 22 of an inductor is a series resistor $R_S$ and an inductor L in parallel with a capacitor C. The resistor $R_S$ represents the dc coil resistance along with the increased wire resistance at rf frequencies due to the skin effect (the effect of the current being concentrated nearer to the surface of the wire) as the operational frequency is increased. The capacitor C represents the distributed capacitance between the parallel windings of the coils. Inductance of the inductor L is the nominal component inductance.

At operation below the self-resonant frequency, the impedance of an inductor increases as frequency increases. At the inductor self-resonant frequency, the inductor, as represented by a parallel L/C circuit of FIG. 3, resonates as an open circuit creating a maximum impedance to the rf signal. At operation higher than the self-resonant frequency, the distributed capacitance of the capacitor C dominates the rf impedance resulting in the impedance decreasing with increasing frequency. The inductor self-resonant frequency is given as: $F_{SR}=1/[2\pi*\sqrt{(LC)}]$.

The resistance of the resistor $R_S$ limits the maximum impedance of the self-resonant inductor. That is, a quality factor (Q) of the inductor is the ratio of an inductor's reactance to its series resistor's $R_S$ resistance. High-Q inductors, with very low resistances, have very high self-resonant impedances, but for only a narrow bandwidth. Lower-Q inductors, with higher resistances, have lower self-resonant impedances for a much broader bandwidth.

This self-resonant feature is used in the circuit to prevent the rf signal from coupling onto the dc bias lines and to aide the decoupling capacitors in preventing rf crosstalk between the two, or more, FETs. For narrow-band operation, very high-Q inductors are desired to maximize series impedance. Quarter wave transformers may also be used for this function in narrow-band applications. For broad-band operation, lower-Q inductors are desired to obtain a high impedance across a larger bandwidth. In either application, the inductor must be capable of passing the maximum dc current without breakdown.

Utilizing the self-resonant characteristics of decoupling capacitors, such as the decoupling capacitors C5 and C6, is required to optimize rf performance while maximizing dc-rf conversion efficiency, particularly in applications where the rf power exceeds 100 milliwatts.

Figure 4:
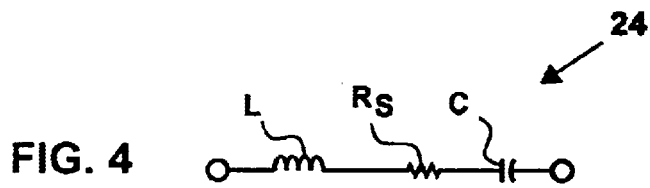
FIG. 4 is model for simulating a microwave capacitor.

Referring now to FIG. 4, a microwave circuit model 24 of a capacitor is an inductor L in series with a resistor $R_S$ in series with a capacitor C. The inductor L represents the inductance of the leads and the capacitor plates. The resistor $R_S$ represents the equivalent series resistance (ESR) of the capacitor. Capacitor dielectric losses, metal plate losses, and skin effects all contribute to the ESR. The capacitor C is the nominal component capacitance.

These parasitic effects of a capacitor at microwave frequencies alter its impedance characteristics in the opposite manner as that of an inductor. At operation below the self-resonant frequency, a capacitor decreases in impedance as frequency increases. At the capacitor self-resonant frequency, a capacitor, as represented by a series L/C circuit of FIG. 4, resonates as a short circuit creating a minimum impedance to the rf signal. At frequencies higher than the self-resonant frequency, the lead and plate inductance of the inductor L dominates the rf impedance resulting in the impedance increasing with increasing frequency. The capacitor self-resonant frequency equation is: $F_{SR}=1/[2\pi*\sqrt{(LC)}]$, which is the same as for the inductor.

The rf impedance of a capacitor at self-resonant frequency is equal to the ESR. As in the case of the inductor L, the quality factor Q of a capacitor is the ratio of a capacitor's reactance to its ESR, or alternatively the quality factor Q is 1/DF where DF is the dissipation factor of the capacitor. High-Q capacitors, with very low ESR, have very low self-resonant impedances, but for only a narrow bandwidth. Lower-Q capacitors, with higher ESR, have lower self-resonant impedances for a much broader bandwidth. Presently, the preferred capacitor dielectric used to minimize capacitor ESR is porcelain. Porcelain has a dissipation factor, DF, of 0.00007, the lowest of all currently available capacitor dielectrics.

To minimize the rf impedance from the FET source terminal to a circuit ground, decoupling capacitors with self-resonant frequencies at or very near to the amplifier operational frequency are required in higher rf power applications.

The power dissipated in the decoupling capacitor is $P_{DISS}=I^2*ESR$, where I is the root-mean-square, or rms, of the rf current through the capacitor. Alternatively, $P_{DISS}=P_{RF}*ESR/Z$ where Z is the circuit load impedance, typically 50.0 ohms, and $P_{RF}$ is the rf output power of the FET.

For optimal performance, the ratio of FET rf output power, $P_{RF}$, to decoupling capacitor power dissipated, $P_{DISS}$, should be no less than 2000 for medium rf power, which is defined as 100 milliwatts to 2.0 Watts FET rf output power. For high power rf applications, which is defined as FET output power greater than 2.0 Watts, the $P_{RF}/P_{DISS}$ ratio should be no less than 5000.

Very high-Q decoupling capacitors are necessary to minimize series impedance to a circuit ground, whether it be for narrow-band, or wide-band operation. For broad-band operation, multiple high-Q decoupling capacitors with self-resonant frequencies selected at several points in the operating frequency band are optimally selected for minimum ESR across a broad frequency band.

Figure 5:
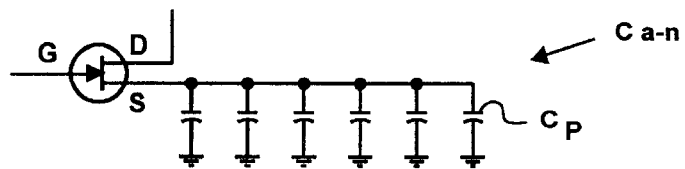
FIG. 5 shows the use of multiple decoupling capacitors to minimize the equivalent series resistance (ESR) of the decoupling capacitors.

Referring now to FIG. 5, parallel-connected capacitors Ca-n, that include two or more multiple porcelain dielectric capacitors $C_P$, each with self-resonant frequencies at or near the amplifier frequency, are connected in parallel from the FET source terminal to a circuit ground to achieve the required reduction in the ESR that is required for decoupling in high power rf applications.

Paralleling a plurality of capacitors at the self-resonant frequency divides the ESR in the same manner as paralleling resistors. However, if a capacitor is not available with a resonant frequency that closely matches an operating frequency for narrow-band operation, two paralleled capacitors are chosen with one having a resonant frequency above the narrow-band frequency, and the other having a resonant frequency below the narrow-band frequency.

Referring now to FIGS. 1, 2, 7, 8, and 9, preferably the effective series resistances of the decoupling capacitors C5 and C6 each have an effective series resistance of less than 0.4 ohms divided by the rf output power. More preferably, all of these decoupling capacitors have an ESR of 0.20 ohms divided by the rf output power.

If the required ESR, as calculated by either of the formulas given above, for any or all of the decoupling capacitors C5 and C6 cannot be met by a single capacitor, any or all may be replaced by any number of parallel-connected capacitors Ca-n, as shown in FIG. 5.

Porcelain capacitors presently have the lowest dielectric resistance and are preferred for minimizing the effective rf impedance. Porcelain capacitors, model 600S, manufactured by American Technical Ceramics of Huntington Station, N.Y., are suitable for rf decoupling as taught herein.

Model 600S capacitors that are available from American Technical Ceramics, their self resonant frequencies, their capacities, and their effective series resistances, are included in the following table.

TABLE 1

Porcelain Capacitors
Self Resonant Frequencies vs. ESRs

| Self Resonant Freq. | Capacitance | ESR |
|---|---|---|
| 1 Ghz | 100 pF | 0.07 ohms |
| 2 Ghz | 40 pF | 0.09 ohms |
| 4 Ghz | 15 pF | 0.15 ohms |

TABLE 1-continued

Porcelain Capacitors
Self Resonant Frequencies vs. ESRs

| Self Resonant Freq. | Capacitance | ESR |
|---|---|---|
| 8 Ghz | 3 pF | 0.20 ohms |
| 16 Ghz | 1 pF | 0.30 ohms |

Referring now to FIG. 5 and Table 1, as an example of capacitor paralleling to achieve a required ESR, assume an rf output of 5.0 Watts, using the 0.2 ohms/Watts criteria, the ESR of the decoupling capacitor should be 0.04 ohms. Assuming an operating frequency of 4 Ghz, from Table 1, the ESR for a porcelain capacitor is 0.15 ohms, so four capacitors must be paralleled to achieve the required ESR.

Packaged GaAsFETs typically have a considerable source lead parasitic inductance. By choosing a decoupling capacitor, or capacitors, with a value that resonates with the source lead inductance, the true FET source impedance to a circuit ground is further reduced.

Therefore, the package, or lead, inductance of the capacitor, or capacitors, should be considered in the equation for resonance when selecting a capacitor to resonate with the GaAsFET source lead inductance. Additionally, several parallel capacitors with a combined reactance that resonates with the GaAsFET source lead inductance are selected to minimize the decoupling capacitor ESR and maximize efficiency in high power rf applications (FET rf output in excess of 2.0 Watts).

Often in high power packaged FETs the source terminal is the body of the device and is connected to a mounting flange. Conventionally, the flange is connected directly to a circuit ground with metallic screws to achieve minimal rf impedance to an electrical ground and to maximize thermal conductivity between the FET and a circuit ground, which is most often a chassis serving as a heat sink to the FET. However, in the present invention, the source terminals of the FETs are electrically isolated from a circuit ground.

Figure 6:
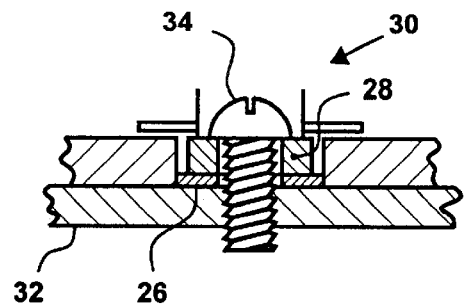
FIG. 6 is a side elevation, in partial cross section, of a high-power rf FET that is mounted to achieve maximum thermal conduction while maintaining electrical isolation of the source terminal from electrical ground.

Referring now to FIG. 6, a thermally conductive, electrically insulating pad 26 is inserted between a FET mounting flange 28 of a FET 30 and a heat sink, or chassis, 32 to allow the dissipated heat of the FET 30 to flow to the heat sink 32 while maintaining electrical isolation. The electrical insulating material of the pad 26 should have no higher than 0.5° C./Watt thermal resistance. An insulating material with a higher thermal resistance, combined with the thermal resistance of the FET 30 and the ambient temperature, may result in the internal junction temperature of the FET 30 being excessive, thereby causing reduced reliability or destruction of the FET 30.

A suitable material for the insulating pad 26 is DeltaPad Thermally Conductive Insulator, Part Number 174-9 Series, manufactured by Wakefield Engineering of Pelham, N.H. The material for the insulating pad 26 is 0.22 millimeters (0.009 inches) thick, has a thermal resistance of 0.25° C./W, a resistivity of $10^{13}$ megohms per cubic centimeter of volume, and a 5000 volt breakdown.

The mounting flange 28 is held in heat-conducting contact with the insulating pad 26 and with the heat sink 32, with non-ferrous, or non-conductive, screws 34. The tensile strength and stretching of the material for the screws 34, along with the manufacturer-recommended FET mounting flange 28, must be taken into account when selecting fasteners.

Figure 7:
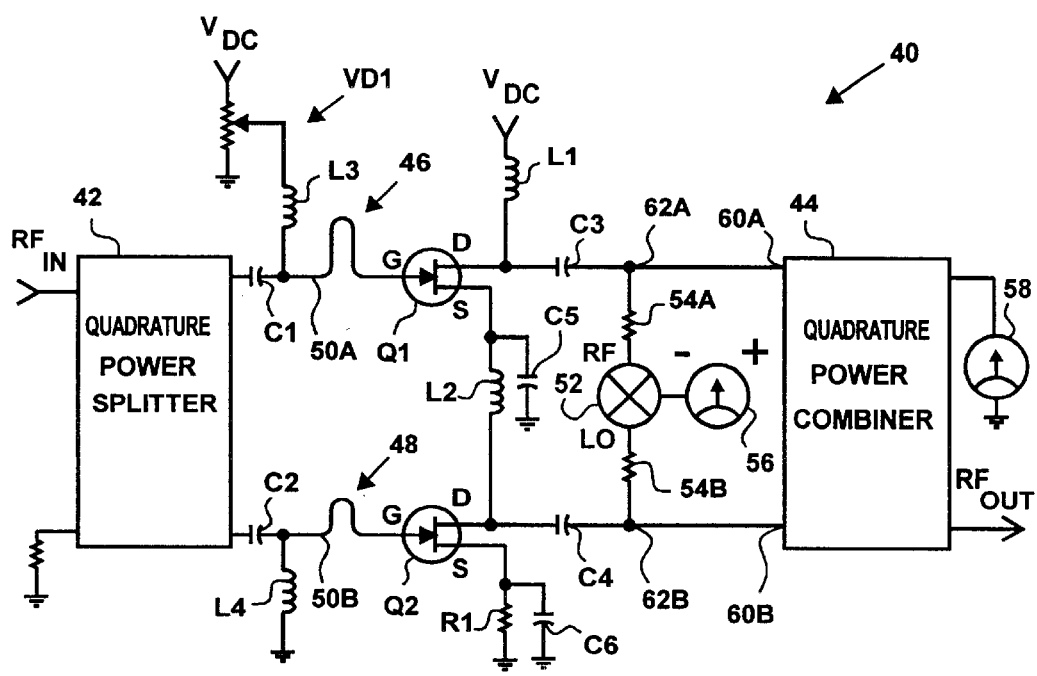
FIG. 7 is a first embodiment of the present invention in which a variable rf power amplifier is generally as shown in FIG. 1, and means is included for correcting both phase errors and inequalities in the amplitudes of the rf signals that are to be combined.

Referring now to FIG. 7, an rf power amplifier 40 includes parts as named and described in conjunction with FIG. 1, except that the fixed voltage divider FD1 has been replaced by the variable voltage divider VD1, and except that a quadrature power splitter 42 and a quadrature power combiner 44 have replaced the power splitter 12 and the power combiner 14 of FIG. 1. In addition, a larger phase-adjusting loop, or tuning loop 46, and a smaller phase-adjusting loop, or tuning loop 48, have been inserted into conductors 50A and 50B, respectively. Also, an rf mixer 52, resistors 54A and 54B, a voltmeter 56, and a power meter 58 have been added.

Operation of the rf power amplifier 40 is the same as that of the rf power amplifier 10 of FIG. 1, except for two general areas of improvement. First, some of the added components, as listed above, provide means for measuring a voltage that is a function of any out-of-phase condition that may exist at rf inputs 60A and 60B of the quadrature power combiner 44. Other of the added components provide means for correcting any imbalance in the amplitude of rf signals supplied to the quadrature power combiner 44.

Obviously, frequencies provided by the quadrature power splitter 42 will be equal, and frequencies in conductors 62A and 62B will be equal, so that equal frequencies will be applied to the RF and LO inputs of the rf mixer 52. Therefore, any phase error in the quadrature inputs to the rf mixer 52 will show up as a dc voltage at the voltmeter 56. While a given dc voltage will not represent a known phase error, the fact that there is a dc voltage will indicate that a phase error exists. Further, the polarity of the dc voltage will indicate the direction of the phase error.

Figure 10:
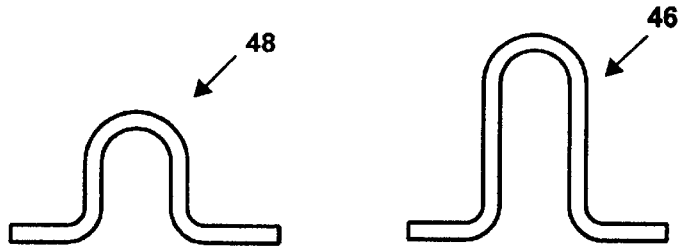
FIG. 10A is an enlarged view of the larger and smaller phase-adjusting loops.
FIG. 10B is an enlarged view of the larger and smaller phase-adjusting loops with a jumper selectively positioned on the larger phase-adjusting loop and an excess portion of the larger phase-adjusting loop removed.
Figure 10:
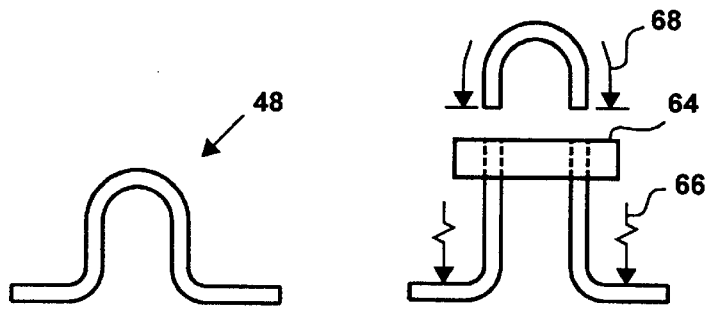

Referring now to FIGS. 7, 10A, and 10B, a jumper 64 of FIG. 10B is attached to the larger phase-adjusting loop 46 and is used to shorten the loop 46 to whatever length 66 provides the least dc voltage on the voltmeter 56. Obviously, an increasing voltage indicates changing the length of the loop 46 in the wrong direction. After removing the excess portion 68 of the loop 46, the voltmeter 56 may indicate a need to reposition the jumper 64 somewhat.

Continuing to refer to FIG. 7, subsequent to correction of phase angles, any power loss that results from combining the rf signals in the quadrature power combiner 44 will be due to inequalities in amplitudes of the rf signals that are delivered to the rf inputs 60A and 60B. This power loss is measured by the power meter 58.

Figure 8:
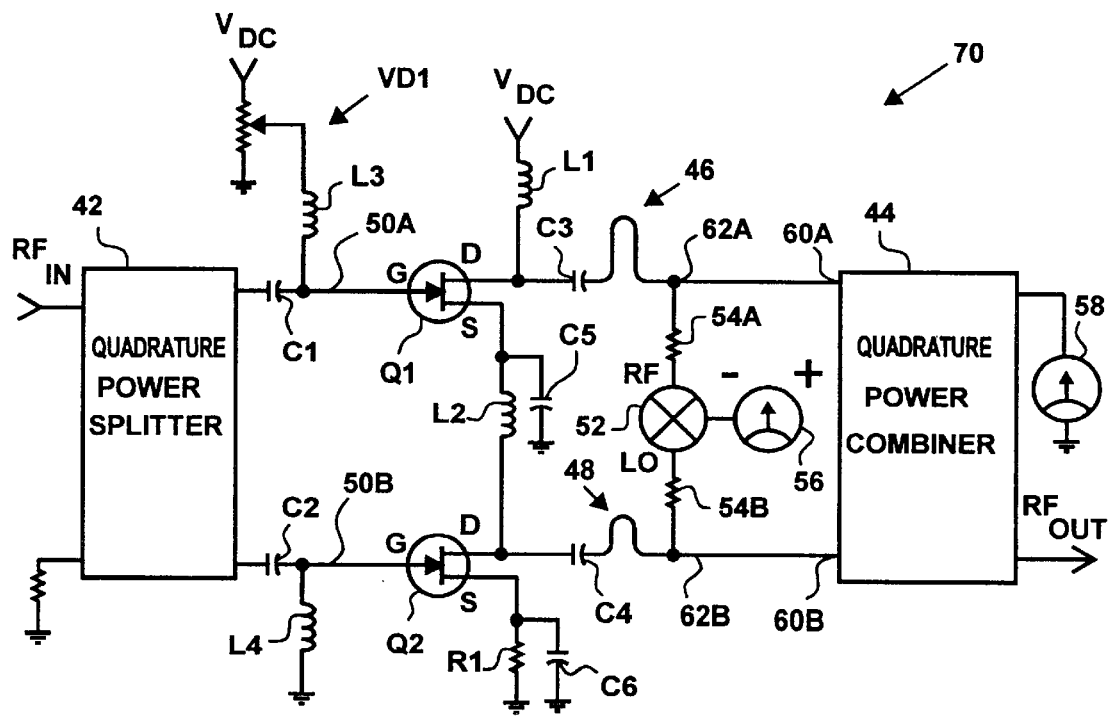
FIG. 8 is a second embodiment of the variable rf power amplifier of the present invention, and is the same as that of FIG. 7, except that the larger and smaller phase-adjusting loops are repositioned to be between the drain terminals of the FETs and the inputs of the power combiner.
Figure 9:
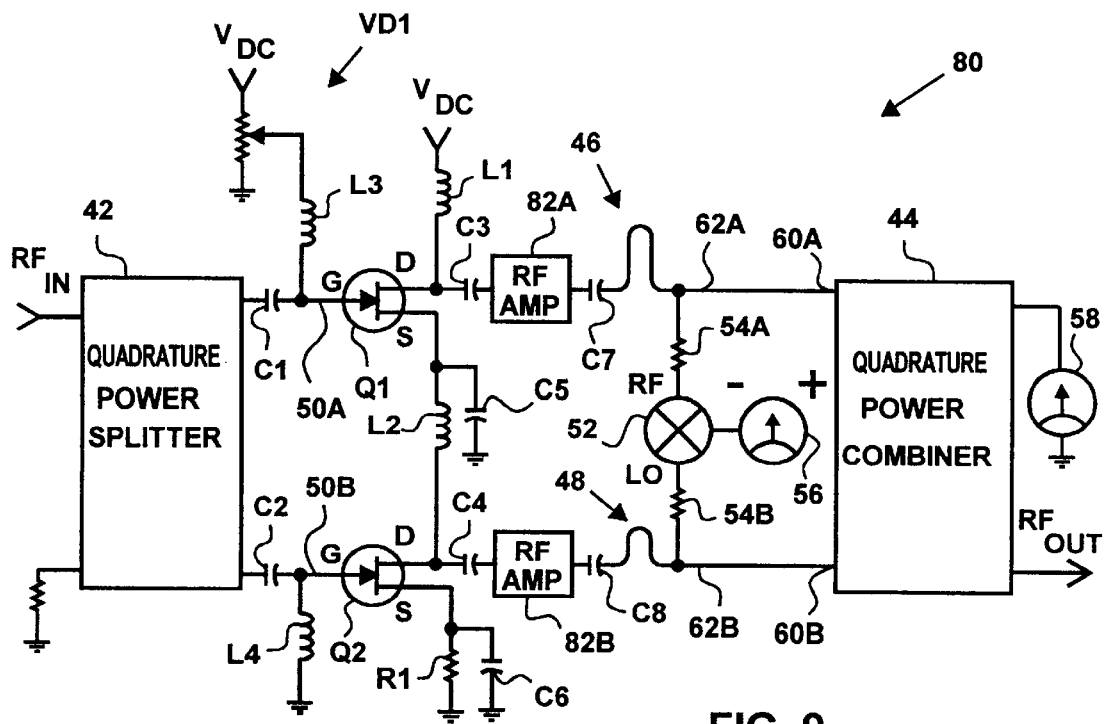
FIG. 9 is a third embodiment of the variable rf power amplifier of the present invention, and is the same as that of FIG. 8, except that a pair of high-power rf amplifiers have been inserted intermediate of the FETs and the rf mixer.

The power meter 58 of FIGS. 7, 8, and 9 replaces a resistor that commonly is connected between a combiner and ground, as shown in FIGS. 1 and 2. That is, the resistor that is connected between the power combiner 14 and ground dissipates power losses that include both phase angle errors and amplitude inequalities in the rf signals that are combined.

Referring again to FIG. 7, equalization of the amplitudes of the rf signals is achieved by adjusting the bias voltage that is supplied to the gate of the FET Q1 by the variable voltage divider VD1 while observing consequent reductions in power loss as indicated by the power meter 58. This adjustment of the gate voltage for the FET Q1 reproportions the bias voltage that is applied to the gate of the FET Q1, thereby selectably proportioning the voltages across the FETs Q1 and Q2, and selectably reproportioning the gains of the FETs Q1 and Q2.

Referring now to FIG. 8, an rf power amplifier 70 includes all of the parts shown and described in conjunction with FIG. 7, the difference being that the phase-adjusting loops, or tuning loops, 46 and 48, have been relocated. Since the mixer 52 is located immediately ahead of the quadrature power combiner 44, phase correction can be made either before or after amplification by the FETs Q1 and Q2. Therefore, the embodiments of FIGS. 7 and 8 provide equal advantages, except that any phase-angle errors introduced by the FETs Q1 and Q2 will not be detected by the embodiment shown in FIG. 7.

Referring now to FIG. 9, an rf power amplifier 80 includes all of the parts shown and described in conjunction with FIGS. 7 and 8. In addition the rf amplifier 80 includes high-power rf amplifiers 82A and 82B and coupling capacitors C7 and C8 that are interposed between respective ones of drain terminals of the FETs Q1 and Q2 and the quadrature power combiner 44.

Thus, the mixer 52 is located to provide voltages that are indicative of phase angle errors that occur after high-power amplification, and adjustment of the larger tuning loop 46 is effective for correcting phase-angle errors that occur up to, and in, the high-power amplifiers 82A and 82B. While the tuning loops 46 and 48 have been shown located as in FIG. 8, obviously, the tuning loops 46 and 48 can be located as shown in FIG. 7. That is, the tuning loops 46 and 48 must be located ahead of the quadrature power combiner 44.

While the preceding discussion has focused on use of GaAsFETs in totem pole circuit at microwave frequencies for frequencies of 3 Ghz, or higher, there are also efficiency advantages to using the totem pole circuit at lower frequencies, such as the "L" and "S" bands (1 to 3 Ghz).

At these lower frequencies, silicon bipolar transistors operated in Class C are the most commonly used amplification device. However, GaAsFETs, in totem pole arrangement, provide an improvement in amplifier efficiency over that achieved by the use of silicon bipolar transistor amplifiers.

There are two basic reasons for this improvement in efficiency. First, the GaAsFETs, with efficiencies up to seventy percent, are inherently more efficient than silicon bipolar transistors at "L" and "S" bands. Second, the high gain of GaAsFETs at "L" and "S" bands (up to 20 Db) versus silicon bipolar transistors (about 10 Db) result in fewer total amplification stages to achieve the desired rf power output.

Therefore, the use of GaAsFETs at these lower frequencies results in the elimination of stage(s) and allows for lower power driver stages. And the high gain of the GaAsFETs makes the power-added efficiency (PAE) higher than that of traditional Class C silicon bipolar transistors despite the Class A or A/B operation of the GaAsFET.

While GaAsFETs have been shown and described, it should be understood that the principles taught herein may be applied to other types of solid-state current devices.

With regard to methods of the present invention, a method for minimizing power losses when combining rf signals in two conductors that are at quadrature phase angles includes: producing a dc voltage that is a function of a phase-angle deviation from quadrature; and correcting the phase-angle deviation. The producing step includes mixing the rf signals; and the correcting step includes nulling the dc voltage. The nulling step includes tuning a length of a selected one of the two conductors.

The tuning step includes interposing a larger tuning loop into the selected one of the conductors; interposing a smaller tuning loop into the other of the conductors; and adjusting an effective length of the larger tuning loop. The adjusting step includes sliding a slider over the larger tuning loop. Preferably the tuning step includes removing an excess length from the larger tuning loop subsequent to the sliding step.

Optionally, the method includes readjusting the effective length of the larger tuning loop subsequent to the removing step.

Methods of the invention include: replacing a grounding resistor of the rf combiner with a power meter; using the power meter to measure a power loss that is a function of an inequality in amplitudes of the rf signals; and equalizing the amplitudes of the rf signals as indicated by reductions in the measured power loss. Optionally, methods of the invention include: measuring a power loss that is a function of both a phase-angle deviation and an inequality in amplitudes of the rf signals; and equalizing the amplitudes of the rf signals as indicated by reductions in the measured power loss either prior to or subsequent to the step of correcting the phase-angle deviation.

Methods of the present invention includes series connecting upper and lower solid-state current devices between a dc supply voltage and a lower dc voltage; splitting an rf input signal into two quadrature rf signals; separately amplifying the quadrature rf signals in the upper and lower solid-state current devices; quadrature combining the separately-amplified quadrature rf signals; determining a phase-angle deviation from quadrature that exists between the separately-amplified quadrature rf signals prior to the combining step; correcting the phase-angle deviation prior to the combining step; and the correcting step comprises producing a dc voltage that is a function of a phase-angle deviation from quadrature.

Additionally, the correcting step includes, either prior to or subsequent to the correcting of the phase-angle deviation, measuring a power loss that is a function of an inequality in amplitudes of the separately-amplified rf signals, and reducing the measured power loss. The reducing step includes adjusting a bias voltage of one of the solid-state current devices.

The present invention can be characterized as connecting a plurality of field-effect transistors in series for dc operation while the same transistors operate in parallel for rf operation. Additionally, the present invention provides a method for minimizing the rf impedance from field-effect transistor sources to a circuit ground, thereby maximizing dc-rf conversion efficiency while minimizing interference between field-effect transistors, and between field-effect transistors and power supply, by design and selection of decoupling capacitors and rf chokes.

Finally, in addition to characterization of the present invention as provided in the preceding paragraph, the present invention can be characterized as having means for correcting phase errors in quadrature rf signals, and as having means for correcting amplitude inequalities in quadrature rf signals prior to quadrature combining.

While specific apparatus and method have been disclosed in the preceding description, it should be understood that these specifics have been given for the purpose of disclosing the principles of the present invention, and that many variations thereof will become apparent to those who are versed in the art. Therefore, the scope of the present invention is to be determined by claims included herein without any limitation by numbers that may be parenthetically inserted in the claims.

What is claimed is:

1. A method for minimizing power losses when combining quadrature if signals from two rf conductors, which method comprises:

a) producing a dc voltage that is an exclusive function of a phase-angle deviation from quadrature;
   b) said producing step comprises mixing said quadrature rf signals;
   c) correcting said phase-angle deviation; and
   d) said correcting step comprises nulling said dc voltage.

2. A method for minimizing power losses when combining quadrature rf signals from two rf conductors, which method comprises:

a) producing a dc voltage that is a function of a phase-angle deviation from quadrature;
   b) said producing step comprises mixing said quadrature rf signals;
   c) correcting said phase-angle deviation; and
   d) said correcting step comprises nulling said dc voltage.

3. A method as claimed in claim 2 in which said nulling step comprises tuning a length of one of said two rf conductors.

4. A method as claimed in claim 2 in which:

a) said nulling step comprises tuning a length of one of said two rf conductors; and
   b) said method further comprises equalizing amplitudes of said quadrature rf signals prior to said correcting step.

5. A method as claimed in claim 2 in which said nulling step comprises:

a) interposing a larger tuning loop into a selected one of said two rf conductors;
   b) interposing a smaller tuning loop into an other of said rf conductors; and
   c) adjusting an effective length of said larger tuning loop.

6. A method as claimed in claim 2 in which said method further comprises equalizing amplitudes of said quadrature rf signals.

7. A method as claimed in claim 2 in which said method further comprises equalizing amplitudes of said quadrature rf signals subsequent to said correcting step.

8. A method as claimed in claim 2 in which said method further comprises:

a) quadrature combining said quadrature rf signals;
   b) measuring a power loss that is generated by said combining step and that is a function of an inequality in amplitudes of said quadrature rf signals; and
   c) equalizing said amplitudes of said quadrature rf signals as indicated by reductions in said measured power loss.

9. A method as claimed in claim 2 in which said nulling step comprises tuning a length of one of said two rf conductors, and said method further comprises:

a) quadrature combining said quadrature rf signals;
   b) measuring a power loss that is generated by said combining step and that is a function of an inequality in amplitudes of said quadrature rf signals; and
   c) equalizing said amplitudes of said quadrature rf signals as indicated by reductions in said measured power loss.

10. A method for rf power amplifying with optimal efficiencies which comprises:

a) series connecting upper and lower solid-state current devices between a dc supply voltage and a lower dc voltage;
    b) splitting an rf input signal into two quadrature rf signals;
    c) separately amplifying said quadrature rf signals in said upper and lower solid-state current devices;
    d) producing a dc voltage that is an exclusive function of a phase-angle deviation from quadrature that exists between said separately-amplified quadrature rf signals;

e) quadrature combining said separately-amplified quadrature rf signals;

f) correcting said phase-angle deviation; and g) said correcting step comprises nulling said dc voltage.

11. A method for rf power amplifying with optimal efficiencies which comprises:

a) series connecting upper and lower solid-state current devices between a dc supply voltage and a lower dc voltage;

b) splitting an rf input signal into two quadrature rf signals;

c) separately amplifying said quadrature rf signals in said upper and lower solid-state current devices;

d) producing a dc voltage that is a function of a phase-angle deviation from quadrature that exists between said separately-amplified quadrature rf signals;

e) said producing step comprises mixing said quadrature rf signals;

f) quadrature combining said separately-amplified quadrature rf signals;

g) correcting said phase-angle deviation; and h) said correcting step comprises nulling said dc voltage.

12. A method as claimed in claim 11 in which said nulling step comprises tuning a length of an rf conductor.

13. A method as claimed in claim 11 in which said nulling step comprises tuning a length of an rf conductor, and said method further comprises:

a) measuring a power loss produced by said combining step that results from amplitude inequalities of said quadrature rf signals; and b) equalizing said amplitudes as indicated by reductions in said measured power loss.

14. A method as claimed in claim 11 in which said nulling step comprises tuning a length of an rf conductor subsequent to said splitting step and prior to said amplifying step.

15. A method as claimed in claim 11 in which said nulling step comprises tuning a length of an rf conductor subsequent to said amplifying step and prior to said quadrature combining step.

16. A method as claimed in claim 11 in which said method further comprises:

a) measuring a power loss that is generated by said quadrature combining step and that is a function of an inequality in amplitudes of said separately-amplified quadrature rf signals;

b) reducing said measured power loss; and c) said reducing step comprises equalizing said amplitudes of said separately-amplified quadrature rf signals.

17. A method as claimed in claim 11 in which said method further comprises:

a) measuring a power loss that is generated by said quadrature combining step and that is a function of an inequality in amplitudes of said separately-amplified quadrature rf signals; and b) reducing said measured power loss.

18. A method as claimed in claim 11 in which said method further comprises:

a) measuring a power loss that is generated by said quadrature combining step and that is a function of an inequality in amplitudes of said separately-amplified quadrature rf signals;

b) reducing said measured power loss;

c) said reducing step comprises equalizing said amplitudes of said separately-amplified quadrature rf signals; and d) said equalizing step comprises adjusting a bias voltage of one of said solid-state current devices.

19. A method for minimizing power losses when combining quadrature rf signals from two rf conductors, which method comprises:

a) producing a dc voltage from said two rf conductors that is a function of a phase-angle deviation from quadrature;

b) said producing step comprises mixing the quadrature rf signals;

c) measuring a power loss that is generated by combining said quadrature rf signals and that is a function of both said phase-angle deviation and unequal amplitudes of said quadrature rf signals;

d) reducing said phase-angle deviation as indicated by reductions in said dc voltage; and e) equalizing said amplitudes of said quadrature rf signals as indicated by reductions in said measured power loss.

20. A method as claimed in claim 19 in which said reducing step is performed before said equalizing step.

21. A method as claimed in claim 19 in which said producing step comprises producing a polarity of said dc voltage that indicates a direction of said deviation from quadrature.

22. A method as claimed in claim 19 in which said reducing step comprises tuning a length of one of said two rf conductors.

23. A method as claimed in claim 19 in which:

a) said producing step comprises producing a polarity of said dc voltage that indicates a direction of said deviation from quadrature; and b) said reducing step comprises tuning a length of one of said two rf conductors.

24. A method as claimed in claim 1 in which:

a) said step of producing a dc voltage comprises producing a polarity that indicates a direction of said phase-angle deviation from quadrature; and b) said correcting and nulling steps further comprise shifting one of said quadrature rf signals in a direction as indicated by said polarity.

25. A method as claimed in claim 1 in which said producing step further comprises producing said dc voltage prior to said combining of said quadrature rf signals.

26. A method as claimed in claim 10 in which:

a) said step of producing a dc voltage comprises producing a polarity that indicates a direction of said phase-angle deviation from quadrature; and b) said correcting and nulling steps further comprise shifting one of said quadrature rf signals in a direction as indicated by said polarity.

27. A method as claimed in claim 10 in which said producing step further comprises producing said dc voltage prior to said combining of said quadrature rf signals.

28. A method as claimed in claim 11 in which said method further comprises:

a) separately amplifying said separately-amplified quadrature rf signals prior to said quadrature combining step;

b) measuring a power loss that is generated by said quadrature combining step and that is a function of an inequality in amplitudes of both of said separate amplifying steps;

c) reducing said measured power loss;

d) said reducing step comprises adjusting said amplitudes of the first said separate amplifying step; and e) said adjusting step comprises adjusting a bias voltage of one of said solid-state current devices.

29. A method as claimed in claim 11 in which said method further comprises:
   a) separately amplifying said separately-amplified quadrature rf signals prior to said quadrature combining step;
   b) measuring a power loss that is generated by said quadrature combining step and that is a function of an inequality in amplitudes of both of said separate amplifying steps;
   c) reducing said measured power loss;
   d) said reducing step comprises compensating for said inequalities in the second said separate amplifying step; and
   e) said reducing and compensating steps comprise making said amplitudes of the first said separate amplifying step unequal.

30. A method for minimizing power losses when combining quadrature rf signals from two rf conductors, which method comprises:
   a) producing a dc voltage whose magnitude is a function of a phase-angle deviation in said rf signals from quadrature, and whose polarity indicates a direction of said deviation from quadrature;
   b) said producing step comprises quadrature mixing said quadrature rf signals;
   c) correcting said phase-angle deviation in accordance with both said magnitude and said polarity; and
   d) said correcting step comprises nulling said dc voltage.

* * * * *

UNITED STATES PATENT AND TRADEMARK OFFICE
CERTIFICATE OF CORRECTION

PATENT NO. : 6,650,180 B2
DATED : November 18, 2003
INVENTOR(S) : Lloyd Lynn Lautzenhiser and Barry Arthur Lautzenhiser It is certified that error appears in the above-identified patent and that said Letters Patent is hereby corrected as shown below:

Column 2,
Line 45, insert -- application -- after "patent";
Line 53, insert -- application -- after "patent";

Column 3,
Lines 61-62, delete "compare with claims";

Column 8,
Line 13, delete "aide", insert -- aid --;

Column 11,
Line 36, insert -- 66 -- between "length" and "of";

Column 16,
Line 9, delete "the", insert -- said --.

Signed and Sealed this

Sixth Day of September, 2005

JON W. DUDAS
*Director of the United States Patent and Trademark Office*